United States Patent
Park et al.

(10) Patent No.: US 7,402,946 B2
(45) Date of Patent: Jul. 22, 2008

(54) ORGANIC ELECTROLUMINESCENCE DEVICE WITH ABSORBENT FILM AND FABRICATION METHOD THEREOF

(75) Inventors: Jae Yong Park, Gyeonggi-do (KR); Nam Yang Lee, Gyeonggi-do (KR); Kwan Soo Kim, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 293 days.

(21) Appl. No.: 10/964,974

(22) Filed: Oct. 15, 2004

(65) Prior Publication Data

US 2005/0122036 A1   Jun. 9, 2005

(30) Foreign Application Priority Data

| Nov. 28, 2003 | (KR) | ............. 10-2003-0085398 |
| Nov. 28, 2003 | (KR) | ............. 10-2003-0085399 |

(51) Int. Cl.
*H01J 1/62* (2006.01)
*H01J 63/04* (2006.01)

(52) U.S. Cl. .............. 313/504; 313/498; 313/506; 313/512; 313/553

(58) Field of Classification Search ............ 313/498, 313/500–504, 506, 512, 549, 553
See application file for complete search history.

(56) References Cited

U.S. PATENT DOCUMENTS

| 5,567,964 A | * | 10/1996 | Kashihara et al. ........... 257/310 |
| 6,849,922 B2 | * | 2/2005 | Park ........................... 257/633 |
| 2001/0015618 A1 | * | 8/2001 | Yamazaki et al. ........... 313/505 |
| 2003/0020181 A1 | * | 1/2003 | Yamada ....................... 257/787 |
| 2003/0143423 A1 | * | 7/2003 | McCormick et al. ........ 428/690 |

FOREIGN PATENT DOCUMENTS

| CN | 1395450 A | 2/2003 |
| CN | 1454030 A | 11/2003 |
| JP | 11-121177 | 4/1999 |
| JP | 2000-36391 | 2/2000 |
| JP | 2003-332044 | 11/2003 |
| JP | 2003-332064 | 11/2003 |

* cited by examiner

*Primary Examiner*—Joseph L. Williams
*Assistant Examiner*—Kevin Quarterman
(74) *Attorney, Agent, or Firm*—Morgan, Lewis & Bockius LLP

(57) ABSTRACT

An organic electro luminescence device includes an array device having a thin film transistor formed in each of sub-pixel regions on a first substrate, a first electrode of an organic electro luminescence diode formed on a second substrate, the first electrode including a metallic material having light transmittance, a second electrode and an organic electro luminescence layer of the organic electro luminescence diode formed on the first electrode, and a thin film type absorbent formed on one of the first substrate and the second substrate, the first and second substrates being attached to each other with a predetermined distance therebetween having the array device facing the organic electro luminescence diode, and including a conductive spacer for electrically connecting the thin film transistor and the second electrode.

13 Claims, 16 Drawing Sheets

ORGANIC ELECTROLUMINESCENCE DEVICE WITH ABSORBENT FILM AND FABRICATION METHOD THEREOF

The present application claims the benefit of Korean Patent Application No. 85398/2003 filed in Korea on Nov. 28, 2003 and Korean Patent Application No. 85399/2003 filed in Korea on Nov. 28, 2003, which are hereby incorporated by reference.

BACKGROUND OF THE INVENTION

1. Field of the Invention

The present invention relates to a display device, and more particularly, to a dual panel type organic electroluminescence device and method for fabricating the same.

2. Discussion of the Related Art

In general, an organic electro luminescence device, which also is referred to as an organic light emitting diode (OLED) device, is a self-emission type display and includes a plurality of pixels and an organic light emitting diode in each of the pixels. Each of the organic light emitting diodes emits light by injecting electrons from a cathode and holes from an anode into an emission layer, combining the electrons with the holes, generating an exciton, and transitioning the exciton from an excited state to a ground state. Accordingly, the organic electro luminescence does not require an additional light source and has a light weight, thin profile, and compact size.

In addition, the organic electro luminescence generally is manufactured using a relatively simple process including a deposition process and an encapsulation process. Thus, an organic electro luminescence has a low production cost. Further, the organic electro luminescence can operate using a low DC voltage, thereby having low power consumption and fast response time. The organic electro luminescence also has a wide viewing angle, and high image contrast. Moreover, the organic electro luminescence is an integrated device. Thus, the organic electro luminescence has high endurance from external impacts and a wide range of applications.

A passive matrix type organic electro luminescence that does not have a switching element has been widely used. In the passive matrix type organic electro luminescence, scan lines intersect signal lines to define a matrix shape device, and the scan lines are sequentially driven to excite each pixel. However, to achieve a required mean luminescence, a moment luminance needs to be as high as the luminance obtained by multiplying the mean luminescence by the number of lines.

There also exists an active matrix type organic electro luminescence, which includes thin film transistors as switching elements within each pixel. The voltage applied to the pixels are charged in a storage capacitor Cst so that the voltage can be applied until a next frame signal is applied, thereby continuously driving the organic electro luminescence, regardless of the number of gate lines, until a picture of images is finished. Accordingly, the active matrix type organic electro luminescence provides uniform luminescent, even when a low current is applied.

FIG. 1 is a schematic view of a pixel of an active matrix type organic electro luminescence device according to the related art. In FIG. 1, a scan line 2 is formed along a first direction, and a signal line 3 is formed along a second direction intersected with the scan line 2, thereby defining a pixel region. A power line also is formed along the second direction and spaced apart from the signal line 3. A switching thin film transistor 5 in the pixel region, and a storage capacitor ($C_{ST}$) 6 is connected between the switching thin film transistor 5 and the power supply line 4. A driving thin film transistor 7, which is a current source element, is connected to the storage capacitor 6 and the power supply line 4.

In addition, an organic electro luminescence diode 8 is connected to the driving TFT 7. When a current is applied to an organic light emitting material of the organic electro luminescence diode 8 in a forward direction, electrons and holes are recombined, moving through a P-N junction between an anode electrode as a hole donor and a cathode electrode as an electron donor. Therefore, the energy of the organic electro luminescence diode 8 becomes lower, thereby generating an energy difference and causing light emission.

The organic electro luminescence may be classified into a top emission type and a bottom emission type based on its light emission direction. FIG. 2 is a schematic sectional view of a bottom emission type organic electro luminescence device according to the related art. In FIG. 2, an organic electro luminescence device 10 includes a first transparent substrate 1. A thin film transistor T, a first electrode 12, an organic luminescent layer 14 and a second electrode 16 are formed on the first substrate 1. The first and second electrodes 12 and 16 form an electric field. If the first electrode 12 is an anode electrode and the second electrode 16 is a cathode electrode, the first electrode 12 includes a transparent conductive material and the second electrode 16 includes a metal material having a low work function. The organic luminescent layer 14 includes a hole injection layer 14a, a hole transporting layer 14b, an emission layer 14c including one of red, green and blue organic luminescence material R, G, B to corresponding to a sub-pixel, and an electron transporting layer 14d.

In addition, the first substrate 1 is adhered to a second substrate 30 by a sealant 40. The first and second substrates 1 and 30 are formed of a transparent insulating material, such as glass or plastic. The second electrode 16 and the second substrate 30 are separated by a distance. A desiccant (not shown) for absorbing moisture from an external and a semi-transparent tape (not shown) for attaching the desiccant to the second substrate 30 are included in the second substrate 30.

FIG. 3 is a detailed sectional view of a sub-pixel region shown in FIG. 2. As shown in FIG. 3, a semiconductor layer 62, a gate electrode 68, source and drain electrodes 80 and 82 are sequentially formed on the first substrate 1 in a thin film transistor portion. A power electrode 72 and an organic electro luminescence diode (E) are respectively connected to the source and drain electrodes 80 and 82. The power electrode 72 connects to a power supply line (not shown), and overlaps a capacitor electrode 64 with an insulator therebetween in a storage capacitor portion. Elements provided at the thin film transistor region and the storage capacitor region, except the organic electro luminescence diode E, form an array device A. The organic electro luminescence diode E includes the first electrode 12 and the second electrode 16 facing each other and sandwiching the organic electro luminescence layer 14. The organic electro luminescence diode E is disposed at an emission region where self-emitting light is emitted outside.

FIG. 4 is a flow chart illustrating a fabrication method of an organic electro luminescence device according to the related art. As shown in FIG. 4, at step ST1, an array device is formed on a first substrate. Forming the array device includes forming a scan line, a signal line, a power line, a switching thin film transistor and a driving thin film transistor.

Then, at step ST2, a first electrode is formed. Forming the first electrode includes connecting the first electrode to the driving thin film transistor. In addition, at step ST3, an organic electro luminescence layer is formed. When the first electrode is an anode electrode, forming the organic electro luminescence layer includes forming, in sequence, a hole injection layer, a hole transporting layer, an emission layer and an electron transporting layer.

At step ST4, the second electrode is formed. The second electrode is formed on the entire surface of the substrate as a common electrode. Then, at step ST5, the first substrate is encapsulated with a second substrate to protect the first substrate from an external impact and to prevent the organic electro luminescence layer from being damaged by an introduction of an external air. A desiccant is included in the second substrate.

However, the organic electro luminescence device according to the related art has a drawback. Since a yield of the array device is multiplied by a yield of the organic electro luminescence diode to determine an overall yield of the organic electro luminescence device, a total yield is greatly limited by a fabrication process of an organic electro luminescence diode. For example, even if the array device is formed with a good quality, the organic electro luminescence device is determined as a failure when the organic electro luminescence layer having a thickness of about 1000 Å is degraded due to a foreign material. As a result, the process and material costs in fabricating the good array device is wasted, and an overall production yield is decreased.

In addition, the bottom emission type device has a limited aperture ratio, thereby limiting its application in high-resolution displays. Thus, a top emission type device is more advantageous because it has an easy design of the thin film transistor and an improved aperture ratio. However, since the top emission type device generally has the cathode electrode disposed on the organic electro luminescence layer, there are limited choices in material for forming the cathode electrode. Thus, the transmittance of the top emission type device is limited by this narrow material selection range, thereby reducing light efficiency. Further, when a thin film type passivation film is used for minimizing a reduction in the light transmittance, external air is not sufficiently cut off from the interior of the top emission type device. Moreover, a problem exists in placing a desiccant in a top emission type device because the array device and the organic electro luminescence layer are formed on different substrates.

SUMMARY OF THE INVENTION

Accordingly, the present invention is directed to an organic electro luminescence device and a fabrication method thereof the same that substantially obviate one or more of the problems due to limitations and disadvantages of the related art.

An object of the present invention is to provide an organic electro luminescence device and a fabrication method thereof that has an absorbent provided within an array of an upper substrate or a lower substrate of the organic electro luminescence device to eliminate internal moisture from the organic electro luminescence device, thereby improving a device life and improving a durability and an impact-resistance stability.

Another object of the present invention is to provide a pattern structure and a method of fabricating the same that provide an organic electro luminescence device and a fabrication method thereof in which a thin layer is formed with a predetermined pattern and an absorption function, within an array and at an outer part of the upper substrate or the lower substrate of the organic electro luminescence device, to eliminate internal moisture from the organic electro luminescence device, thereby improving a device life and improving a durability and an impact-resistance stability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the organic electro luminescence device includes an array device having a thin film transistor formed in each of sub-pixel regions on a first substrate, a first electrode of an organic electro luminescence diode formed on a second substrate, the first electrode including a metallic material having light transmittance, a second electrode and an organic electro luminescence layer of the organic electro luminescence diode formed on the first electrode, and a thin film type absorbent formed on one of the first substrate and the second substrate, the first and second substrates being attached to each other with a predetermined distance therebetween having the array device facing the organic electro luminescence diode, and including a conductive spacer for electrically connecting the thin film transistor and the second electrode.

In another aspect, the method of fabricating an organic electro luminescence device includes forming an array device having a switching unit at each of sub-pixel regions on a first substrate, forming a first electrode on a second substrate, forming an organic electro luminescence layer on the first electrode, forming a second electrode on the organic electro luminescence layer, patterning the organic electro luminescence layer and the second electrode to correspond to each of the sub-pixel regions, forming a thin film type absorbent on one of the first and second substrates, forming a conductive spacer on one of the first and second substrates, aligning the first and second substrates such that the array device is electrically connected to the second electrode via the conductive spacer, and attaching the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
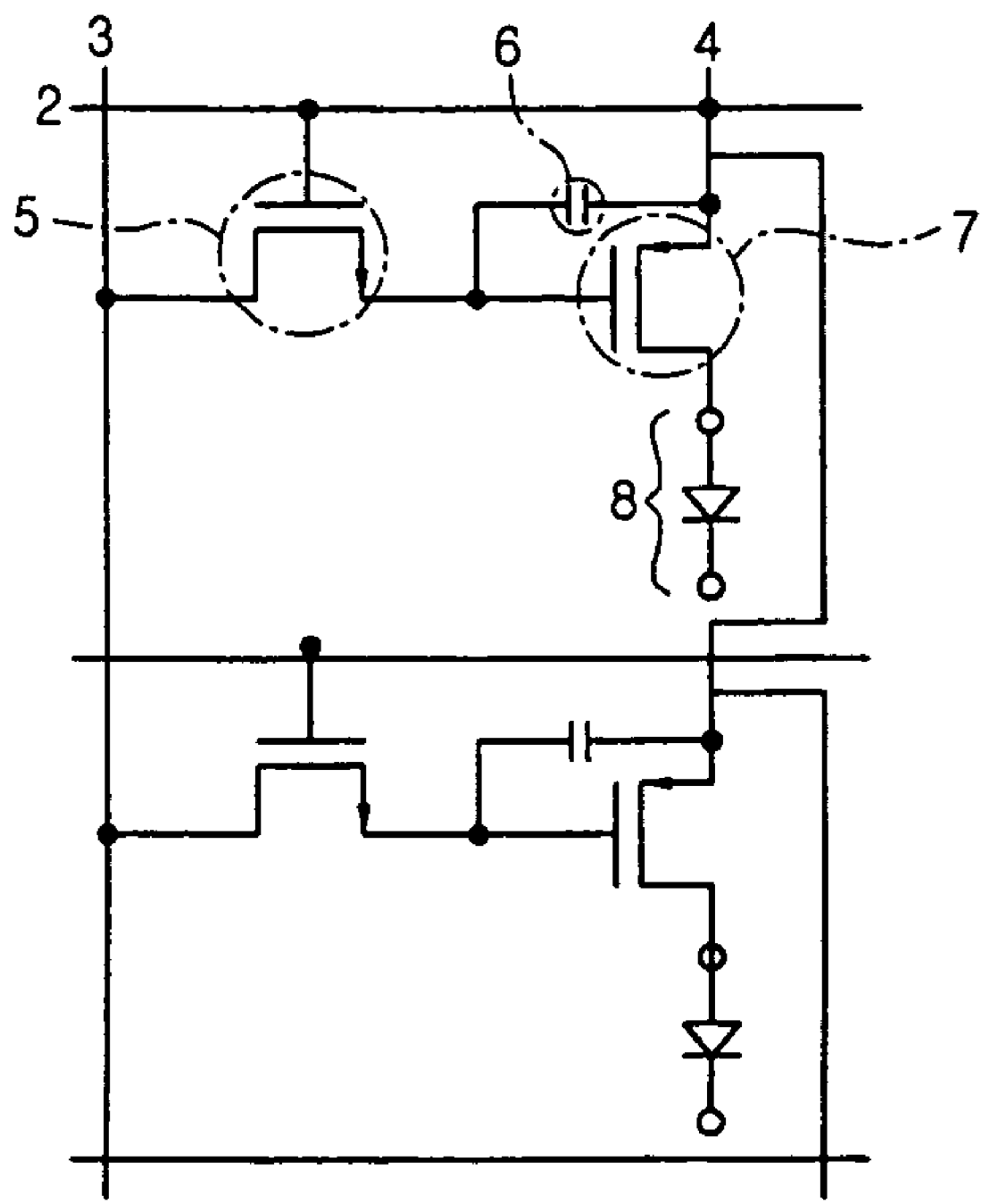
FIG. 1 is a schematic view of a pixel of an active matrix type organic electro luminescence device according to the related art.
Figure 2:
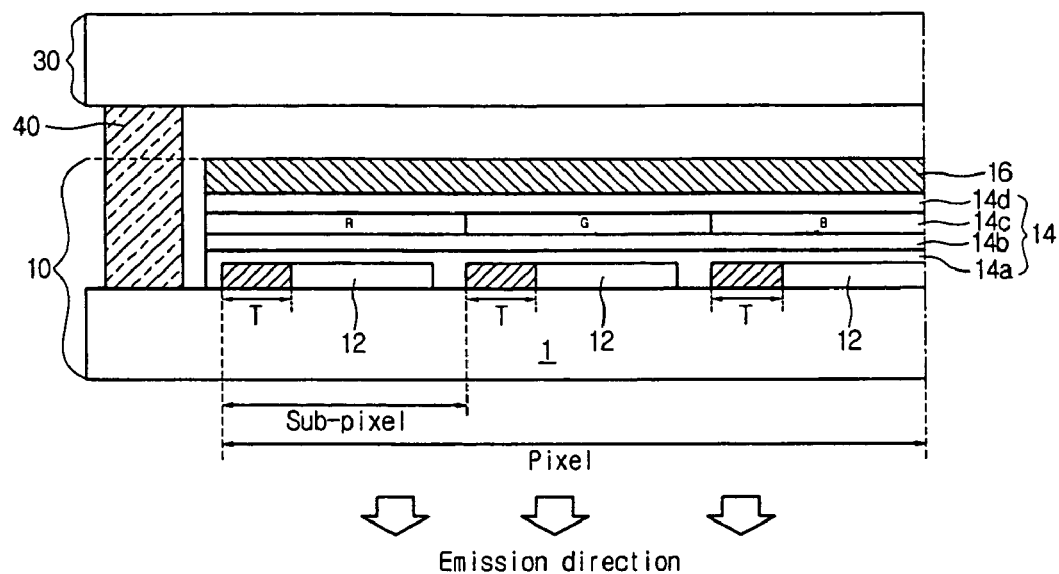
FIG. 2 is a schematic sectional view of a bottom emission type organic electro luminescence device according to the related art.
Figure 3:
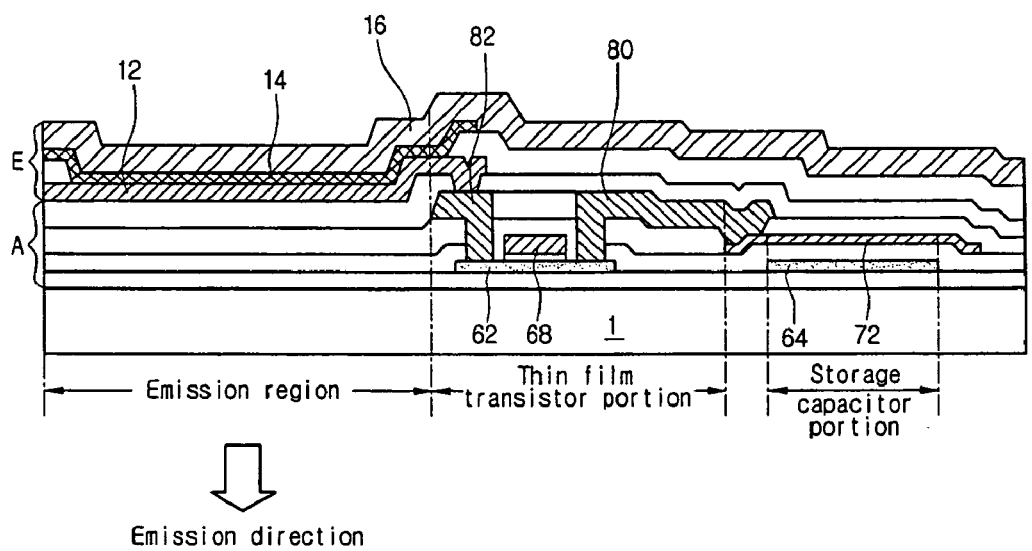
FIG. 3 is a detailed sectional view of a sub-pixel region shown in FIG. 2.
Figure 4:
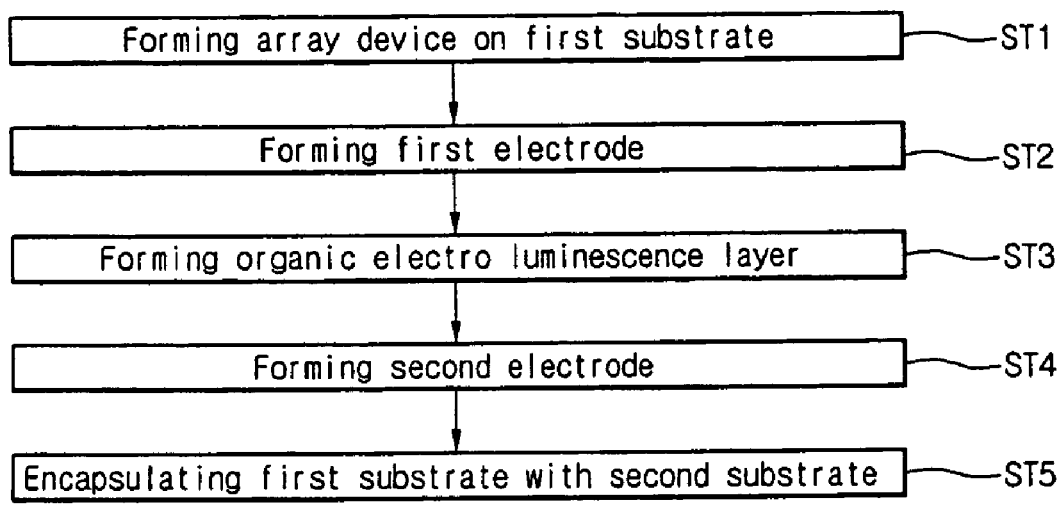
FIG. 4 is a flow chart illustrating a fabrication method of an organic electro luminescence device according to the related art.
Figure 5:
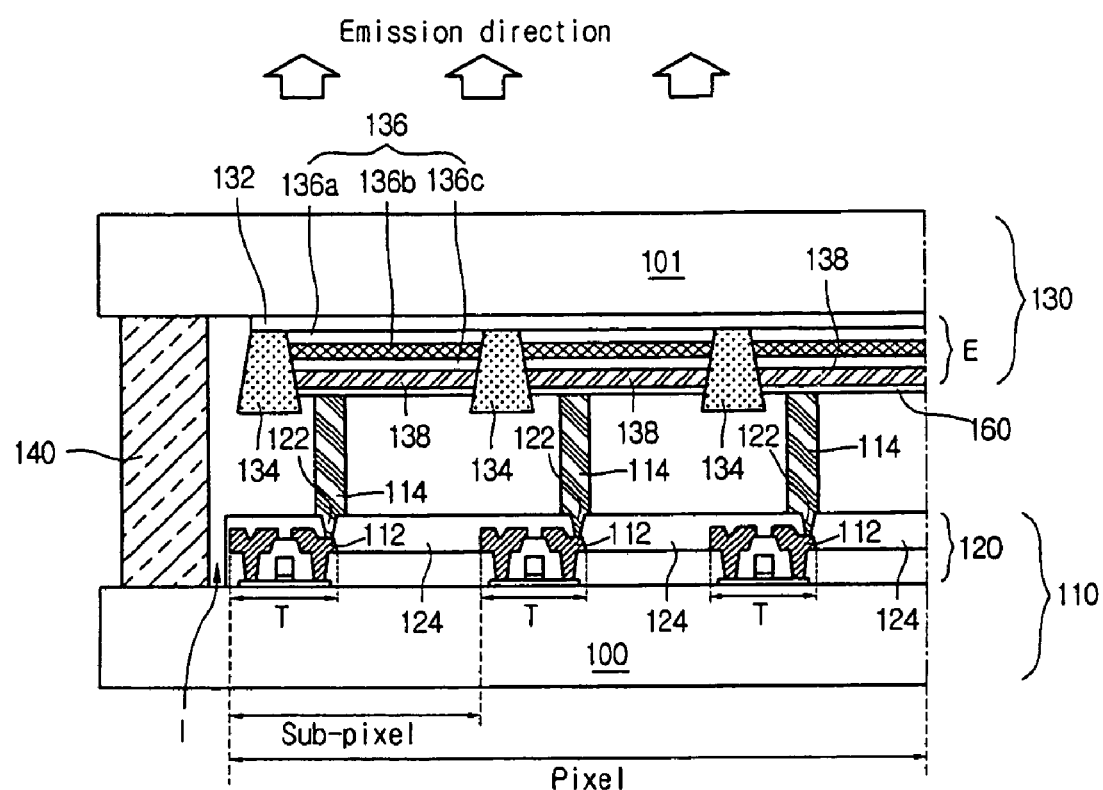
FIG. 5 is a schematic sectional view of a dual panel type organic electro luminescence device according to an embodiment of the present invention.

FIG. 5 is a schematic sectional view of a dual panel type organic electro luminescence device according to an embodiment of the present invention. In FIG. 5, an organic electro luminescence device may include first and second substrates 110 and 130 attached to each other by a seal pattern 140 with a predetermined distance therebetween. An array device 120 may be formed on a first transparent substrate 100 of the first substrate 110, and an organic electro luminescence diode E may be formed on a second transparent substrate 101 of the second substrate 130.

The organic electro luminescence diode E may include a first electrode 132 as a common electrode, barriers 134 corresponding to a boundary of sub-pixel regions, and an organic electro luminescence layer 136 and a second electrode 138 sequentially formed between the barriers 134 corresponding to each of the sub-pixel regions. The organic electro luminescence layer 136 may have a first carrier transferring layer 136a, a luminescence layer 136b and a second carrier transferring layer 136c. The first and second carrier transferring layers 136a and 136c may function to inject and transport electrons or holes to the luminescence layer 136b.

The luminescence layer 136b may include an emission material having one of red, green and blue colors patterned thereon to correspond to the sub-pixel regions. The first and second carrier transferring layers 136a and 136b may include a material based on an arrangement of anode and cathode electrodes. For example, when the first electrode 132 is the anode electrode and the second electrode 138 is the cathode electrode, the first carrier transferring layer 136a may include a hole injection layer and a hole transporting layer and the second carrier transferring layer 136c may include an electron injection layer and an electron transporting layer.

In addition, the array device 120 may include a thin film transistor (TFT) T corresponding to the organic electro luminescence diode E. Although not shown, the array device 120 additionally may include a scan line, a signal line and a power supply line intersected the scan line, a switching thin film transistor disposed at an intersection of the scan line and the signal line, and a storage capacitor.

To supply current to the organic electro luminescence diode E, a columnar-shaped conductive spacer 114 may electrically connect the TFT T to the organic electro luminescence diode E in each of the sub-pixel regions. The conductive spacer 114 also may maintain a cell gap. The conductive spacers 114 may be parallel to the seal pattern 140 and may include a malleable metal material having a low resistance value, and may be formed on the first substrate 110. In particular, a passivation layer 124 may be formed on the first transparent substrate 100 covering the TFT T. The passivation layer 124 may have a drain contact hole 122 for partially exposing a drain electrode 112 of the TFT T, and the conductive spacer 114 may be disposed on the passivation layer 124 contacting the drain electrode 112 through the drain contact hole 122. Alternatively, a contact hole may be formed to expose a source electrode of the TFT T, and the conductive spacer 114 may contact the source electrode via such a contact hole. The conductive spacer 114 is preferably formed in a fabrication process of the array device 120 of the first substrate 110.

According to an embodiment of the present invention, the electro luminescence device is a top emission type ELD which emits light emitted from the organic electro luminescence layer 136 toward the second substrate 130. Thus, the first electrode 132 may be formed of a transparent conductive material while the second electrode 138 may be formed of nontransparent conductive material, e.g., an opaque metal, to prevent the interference caused by light reflection emitted downward. In addition, a separation space I between the first and second substrates 110 and 130 may be at a vacuum state or may be filled with inactive gas, e.g., nitrogen, or an insulating liquid.

Further, a thin film type absorbent 160 may be interposed between the organic electro luminescence diode E and the conductive spacer 114. In particular, the thin film type absorbent 160 may completely cover the second electrode 138 and may include a conductive material. The thin film type absorbent 160 may be formed using a sputtering method. For example, the thin film type absorbent 160 includes one of Group 4A element including zirconium (Zr), titanium (Ti) and hafnium (Hf), Group 5A element including niobium (Nb), tantalum (Ta), chromium (Cr) and molybdenum (Mo), Group 7A element including ferrum (Fe) and ruthenium (Ru), and Group 8A element including nickel (Ni) and cobalt (Co). In addition, the thin film type absorbent 160 may include one of calcium oxide (CaO), barium oxide (BaO), calcium carbonate ($CaCO_3$), phosphorus pentoxide ($P_2O_5$), zeolite, silicagel, and alumina for eliminating moisture inside the device and for maintaining an electrical connection between the organic electro luminescence diode E and the conductive spacer 114.

Moreover, since the second electrode 138 may be formed using an evaporator, the second electrode 138 may be easily peeled off or damaged. Thus, forming the thin film type absorbent 160 covering the second electrode 138 also may provide protection of the second electrode 138.

Figure 6:
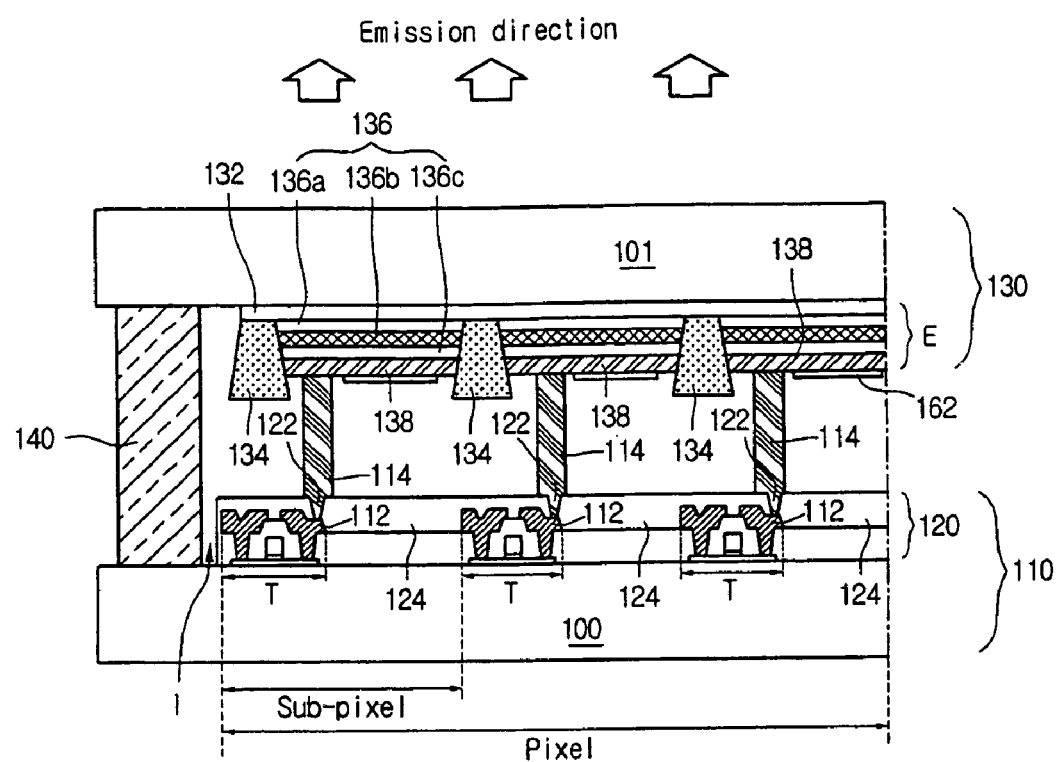
FIG. 6 is a schematic sectional view of a dual panel type organic electro luminescence device according to another embodiment of the present invention.

FIG. 6 is a schematic sectional view of a dual panel type organic electro luminescence device according to another embodiment of the present invention. In FIG. 6, an organic electro luminescence device may include first and second substrates 110 and 130 attached to each other by a seal pattern 140 with a predetermined distance therebetween. An array device 120 may be formed on a first transparent substrate 100 of the first substrate 110, and an organic electro luminescence diode E may be formed on a second transparent substrate 101 of the second substrate 130.

The organic electro luminescence diode E may include a first electrode 132 as a common electrode, barriers 134 corresponding to a boundary of sub-pixel regions, and an organic electro luminescence layer 136 and a second electrode 138 sequentially formed between the barriers 134 corresponding to each of the sub-pixel regions. The organic electro luminescence layer 136 may have a first carrier transferring layer 136a, a luminescence layer 136b and a second carrier transferring layer 136c. The first and second carrier transferring layers 136a and 136c may function to inject and transport electrons or holes to the luminescence layer 136b. The luminescence layer 136b may include an emission material having one of red, green and blue colors patterned thereon to correspond to the sub-pixel regions.

In addition, the array device 120 may include a thin film transistor (TFT) T corresponding to the organic electro luminescence diode E. Although not shown, the array device 120 additionally may include a scan line, a signal line and a power supply line intersected the scan line, a switching thin film transistor disposed at an intersection of the scan line and the signal line, and a storage capacitor.

To supply current to the organic electro luminescence diode E, a columnar-shaped conductive spacer 114 may electrically connect the TFT T to the organic electro luminescence diode E in each of the sub-pixel regions. The conductive spacers 114 may include a malleable metal material having a low resistance value, and may be formed on the first substrate 110. In particular, a passivation layer 124 may be formed on the first transparent substrate 100 covering the TFT T. The passivation layer 124 may have a drain contact hole 122 for partially exposing a drain electrode 112 of the TFT T, and the conductive spacer 114 may be disposed on the passivation layer 124 contacting the drain electrode 112 through the drain contact hole 122.

Further, a thin film type absorbent 162 may be formed covering the second electrode 138 except where the second electrode 138 contacts the conductive spacer 114. Thus, the thin film type absorbent 162 needs not be electrically conductive and may be formed using a wider range of materials, e.g., any material used for a vacuum absorbent, which may absorb moisture as well as gases, e.g., a getter, thereby maintaining a desired atmosphere inside the organic electro luminescence device. For example, the thin film type absorbent 162 may include one of Group 4A element, such as zirconium (Zr), titanium (Ti) and hafnium (Hf), Group 5A element, such as niobium (Nb), tantalum (Ta), chromium (Cr) and molybdenum (Mo), Group 7A element, such as ferrum (Fe) and ruthenium (Ru), and Group 8A element, such as nickel (Ni) and cobalt (Co). Alternatively, the thin film type absorbent 162 may include one of Group 1B element, Group 3B element, and Group 1A element. For example, the thin film type absorbent 162 includes calcium oxide (CaO), barium oxide (BaO), or a combination of CaO and BaO. The thin film type absorbent 162 may be formed using a sputtering method.

Figure 7:
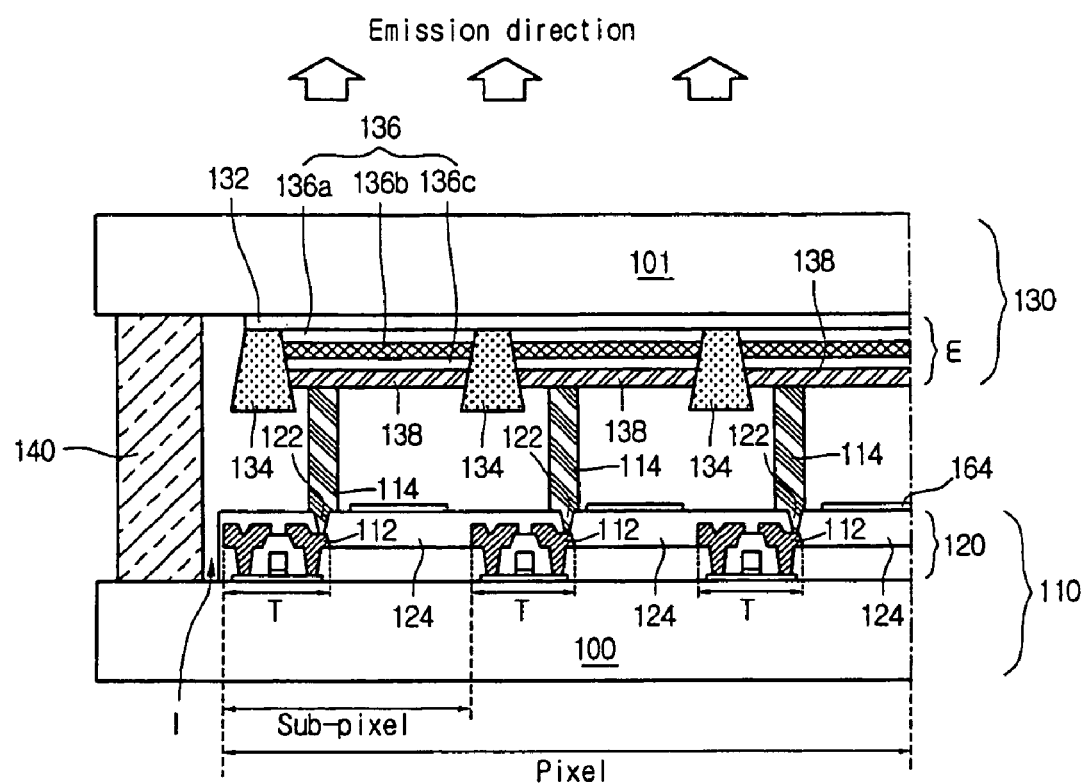
FIG. 7 is a schematic sectional view of a dual panel type organic electro luminescence device according to yet another embodiment of the present invention.

FIG. 7 is a schematic sectional view of a dual panel type organic electro luminescence device according to yet another embodiment of the present invention. In FIG. 7, an organic electro luminescence device may include first and second substrates 110 and 130 attached to each other by a seal pattern 140 with a predetermined distance therebetween. An array device 120 may be formed on a first transparent substrate 100 of the first substrate 110, and an organic electro luminescence diode E may be formed on a second transparent substrate 101 of the second substrate 130.

The organic electro luminescence diode E may include a first electrode 132 as a common electrode, barriers 134 corresponding to a boundary of sub-pixel regions, and an organic electro luminescence layer 136 and a second electrode 138 sequentially formed between the barriers 134 corresponding to each of the sub-pixel regions. The organic electro luminescence layer 136 may have a first carrier transferring layer 136a, a luminescence layer 136b and a second carrier transferring layer 136c. The first and second carrier transferring layers 136a and 136c may function to inject and transport electrons or holes to the luminescence layer 136b. The luminescence layer 136b may include an emission material having one of red, green and blue colors patterned thereon to correspond to the sub-pixel regions.

In addition, the array device 120 may include a thin film transistor (TFT) T corresponding to the organic electro luminescence diode E. Although not shown, the array device 120 additionally may include a scan line, a signal line and a power supply line intersected the scan line, a switching thin film transistor disposed at an intersection of the scan line and the signal line, and a storage capacitor.

To supply current to the organic electro luminescence diode E, a columnar-shaped conductive spacer 114 may electrically connect the TFT T to the organic electro luminescence diode E in each of the sub-pixel regions. The conductive spacers 114 may include a malleable metal material having a low resistance value, and may be formed on the first substrate 110. In particular, a passivation layer 124 may be formed on the first transparent substrate 100 covering the TFT T. The passivation layer 124 may have a drain contact hole 122 for partially exposing a drain electrode 112 of the TFT T, and the conductive spacer 114 may be disposed on the passivation layer 124 contacting the drain electrode 112 through the drain contact hole 122.

Further, a thin film type absorbent 164 may be formed on the passivation layer 124 for absorbing moisture or undesired gases permeated from an external of the panel or generated from films layered within the panel, thereby extending the device life span.

Figure 8:
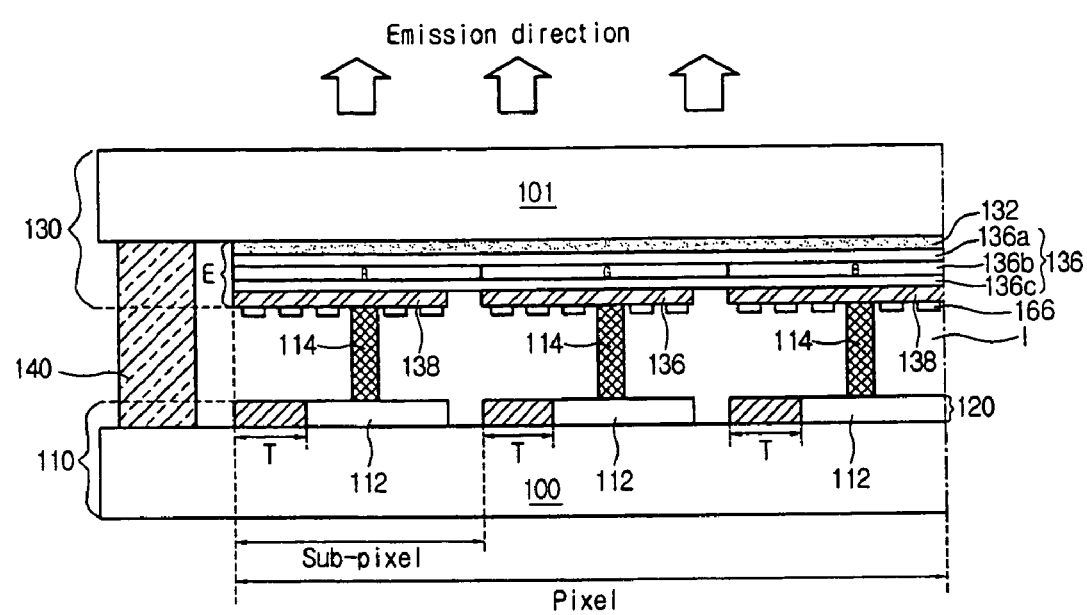
FIG. 8 is a schematic sectional view of a dual panel type organic electro luminescence device according to another embodiment of the present invention.

FIG. 8 is a schematic sectional view of a dual panel type organic electro luminescence device according to another embodiment of the present invention. In FIG. 8, an organic electro luminescence device may include first and second substrates 110 and 130 attached to each other by a seal pattern 140 with a predetermined distance therebetween. An array device 120 may be formed on a first transparent substrate 100 of the first substrate 110, and an organic electro luminescence diode E may be formed on a second transparent substrate 101 of the second substrate 130.

The organic electro luminescence diode E may include a first electrode 132 as a common electrode, an organic electro luminescence layer 136, and a second electrode 138. The organic electro luminescence layer 136 and the second electrode 138 may be selectively patterned to correspond to a plurality of sub-pixel regions. The organic electro luminescence layer 136 may have a first carrier transferring layer 136a, a luminescence layer 136b and a second carrier transferring layer 136c. The first and second carrier transferring layers 136a and 136c may function to inject and transport electrons or holes to the luminescence layer 136b. The luminescence layer 136b may include an emission material having one of red, green and blue colors patterned thereon to correspond to the sub-pixel regions.

In addition, the array device 120 may include a thin film transistor (TFT) T corresponding to the organic electro luminescence diode E. Although not shown, the array device 120 additionally may include a scan line, a signal line and a power supply line intersecting the scan line, a switching thin film transistor disposed at an intersection of the scan line and the signal line, and a storage capacitor.

To supply current to the organic electro luminescence diode E, a columnar-shaped conductive spacer 114 may electrically connect the TFT T to the organic electro luminescence diode E in each of the sub-pixel regions. The conductive spacers 114 may include a malleable metal material having a low resistance value, and may be formed on the first substrate 110. In particular, the conductive spacer 114 may be disposed on the first substrate 110 contacting a drain electrode 112. Alternatively, the conductive spacer 114 may be disposed on the first substrate 110 contacting an electrical connection pattern connected to the drain electrode 112 of the TFT T.

Further, a thin film type absorbent 166 may be formed on the second electrode 138. In particular, the thin film type absorbent 166 may include a plurality of elements having a predetermined shape, and these elements 166 may be formed on the second electrode 138 except where the second electrode 138 contacts the conductive spacer 114. The thin film type absorbent 166 may be formed using a sputtering method.

Figure 9A:
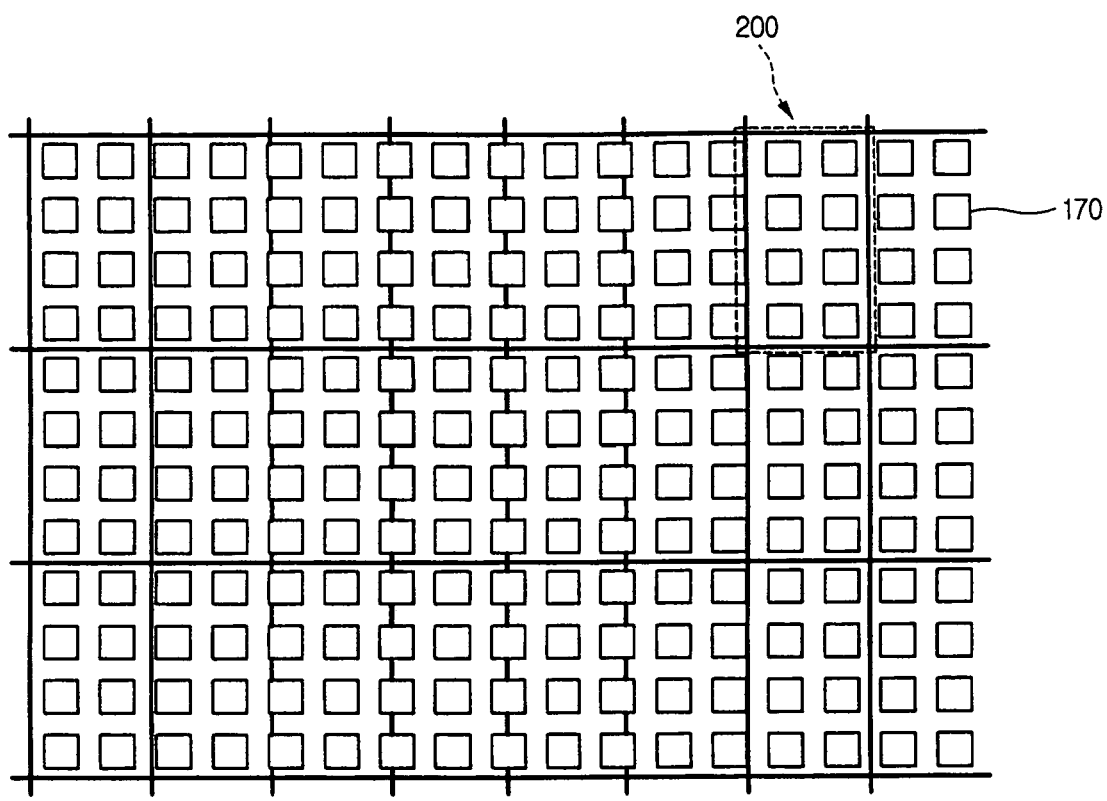
FIGS. 9A to 9C are plan views of an upper substrate of the dual panel type organic electro luminescence device shown in FIG. 8.
Figure 9B:
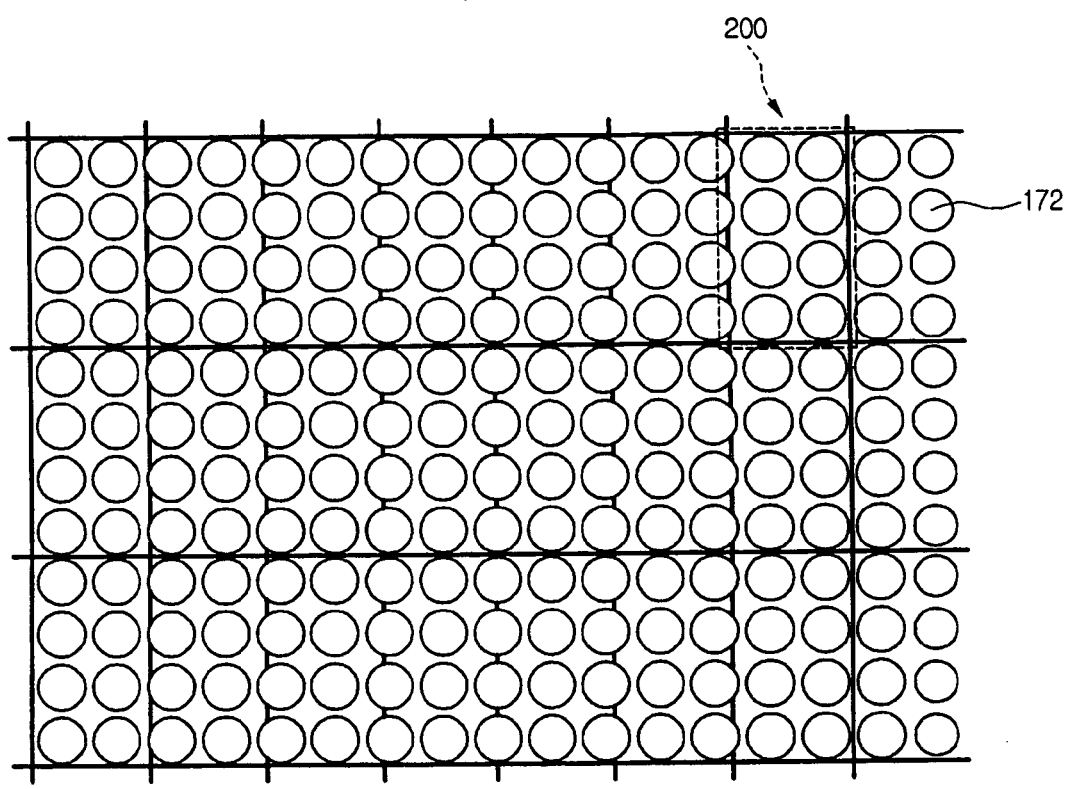
Figure 9C:
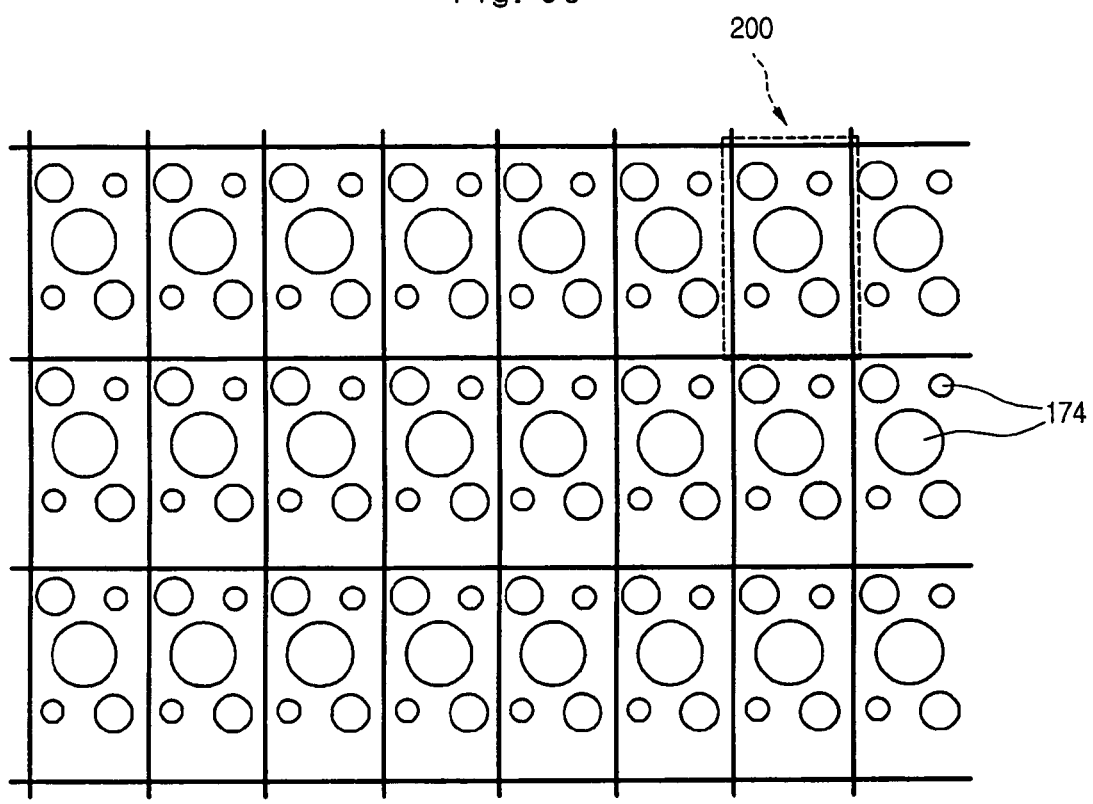

FIGS. 9A to 9C are plane views of the absorbent with respect to the array device shown in FIG. 8. As shown in FIG. 9A, the thin film type absorbent 166 (shown in FIG. 8) may include the plurality of elements having a rectangular shape 170 arranged in a matrix manner with respect to a pixel array 200. Some of the absorbent elements 166 may overlap the date line or the gate line. Alternatively, as shown in FIG. 9B, the thin film type absorbent 166 (shown in FIG. 8) may include the plurality of elements having a circular shape 172 arranged in a matrix manner with respect to the pixel array 200. Further, as shown in FIG. 9C, the thin film type absorbent 166 (shown in FIG. 8) may include the plurality of elements having a same shape but in different sizes 174 arranged with respect to the pixel array 200. Although not shown, the thin film type absorbent may have shapes other than the rectangular or circular shapes shown in FIGS. 9A to 9C.

Figure 10:
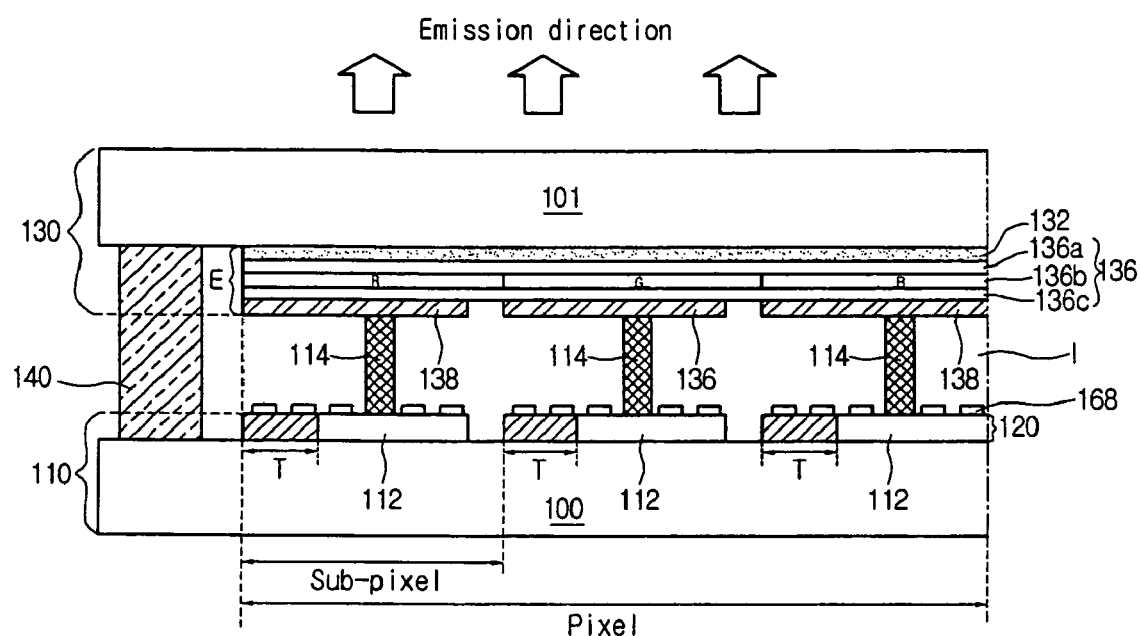
FIG. 10 is a schematic sectional view of a dual panel type organic electro luminescence device according to another embodiment of the present invention.

FIG. 10 is a schematic sectional view of a dual panel type organic electro luminescence device according to another embodiment of the present invention. As shown in FIG. 10, a thin film type absorbent 168 may be formed on the first substrate 110. In particular, the thin film type absorbent 168 may include a plurality of elements formed on the TFT T and the drain electrode 112 of the TFT T except where the drain electrode 112 contacts the conductive spacer 114.

Figure 11A:
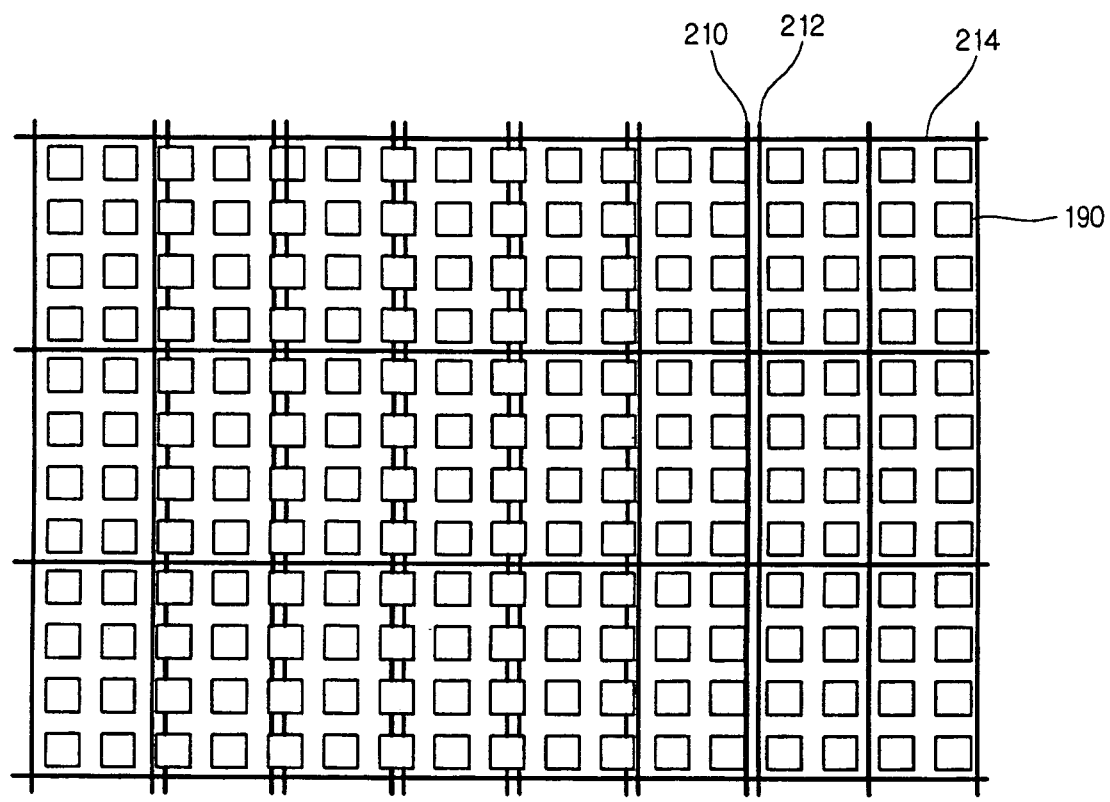
FIGS. 11A to 11C are plan views of a lower substrate of the dual panel type organic electro luminescence device shown in FIG. 10.
Figure 11B:
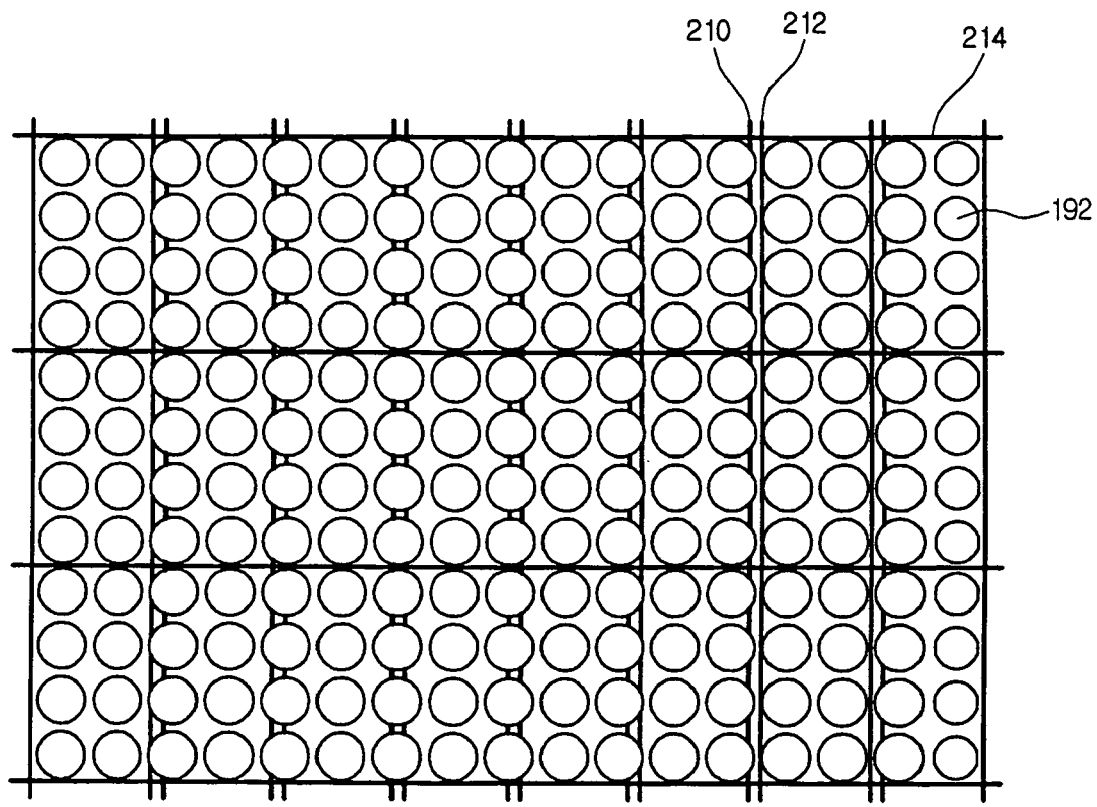
Figure 11C:
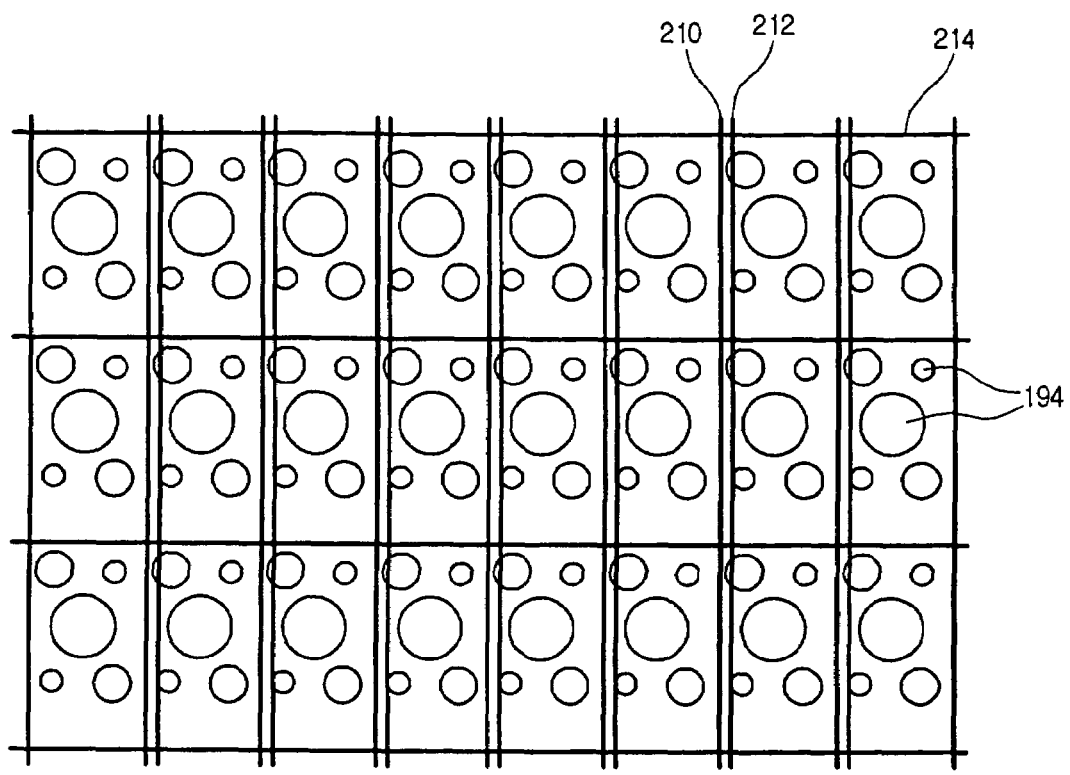

FIGS. 11A to 11C are plan views of a lower substrate of the dual panel type organic electro luminescence device shown in FIG. 10. As shown in FIG. 11A, the thin film type absorbent 168 (shown in FIG. 10) may include the plurality of elements having a rectangular shape 190 arranged in a matrix manner with respect to a pixel array defined by a signal line 210, a power line 212, and a scan line 214. Alternatively, as shown in FIG. 11B, the thin film type absorbent 168 (shown in FIG. 10) may include the plurality of elements having a circular shape 192 arranged in a matrix manner with respect to the pixel array defined by the signal line 20, the power line 212, and the scan line 214. further, as shown in FIG. 11C, the thin film type absorbent 169 (shown in FIG. 10) may include the plurality of elements having a same shape but in different sizes 194 arranged with respect to the pixel array defined by the signal line 210, the power line 212, and the scan line 214.

Figure 12:
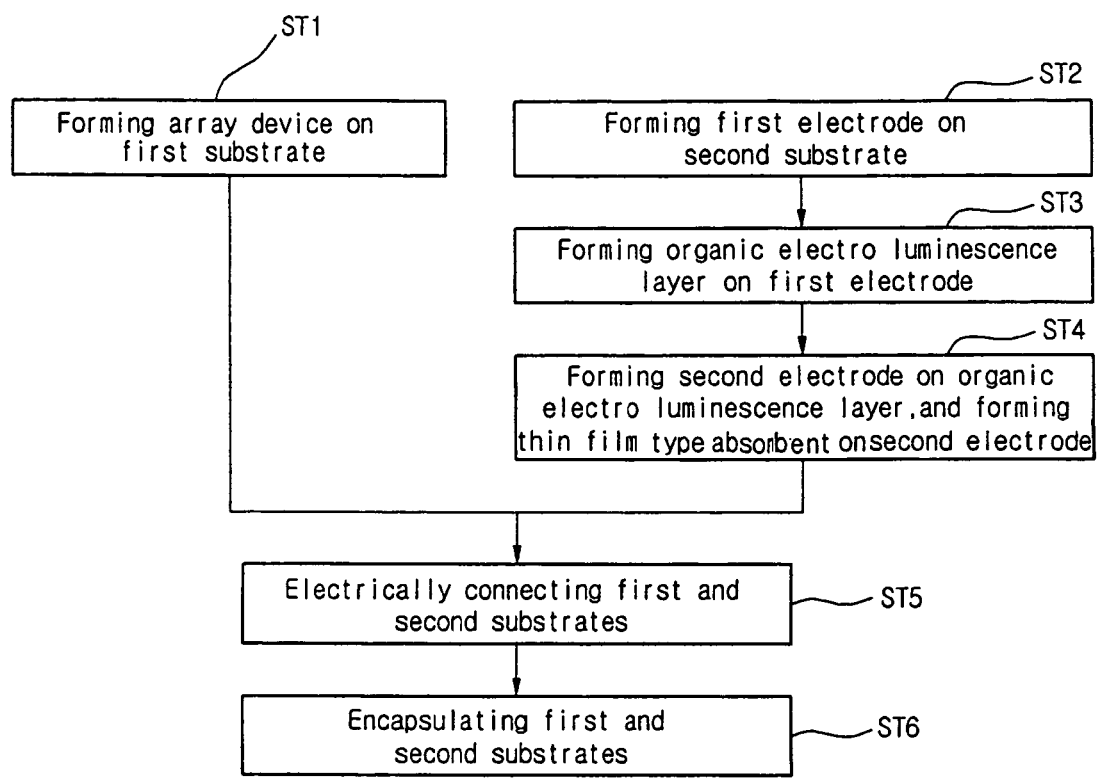
FIG. 12 is a flow chart illustrating a fabrication method of an organic electro luminescence device according to an embodiment of the present invention.

FIG. 12 is a flow chart illustrating a fabrication method of an organic electro luminescence device according to an embodiment of the present invention. As shown in FIG. 12, at step ST1, an array device may be formed on a first substrate. Forming the array device may include forming a buffer layer on the first substrate, forming a semiconductor layer and a capacitor electrode on the buffer layer, forming a gate electrode, source and drain electrodes on the semiconductor layer, and forming a power electrode disposed on the capacitor electrode to be connected with the source electrode. Further, an electrical connection pattern, e.g., a conductive spacer 114 as shown in FIGS. 5, 6, and 8, also may be formed on the first substrate.

In addition, at step ST2, a first electrode may be formed on a second substrate. In particular, since the first electrode for an organic electro luminescence diode may be formed directly on the second substrate, a material selection range is broadened and the process can be easily performed. For example, the first electrode may be selected from the conductive material having a transmittance.

Then, at step ST3, an organic electro luminescence layer may be formed on the first electrode. Further, at step ST4, a second electrode may be formed on the organic electro luminescence layer, and a thin film type absorbent may be formed on the second electrode. Forming the thin film type absorbent may include sputtering a conductive absorbent material on the second electrode for making an electric connection with the conductive spacer formed on the first substrate. In addition, forming the thin film type absorbent may include completely covering the second electrode with the thin film type absorbent. Alternatively, forming the thin film type absorbent may include forming a plurality of elements having a circular shape, a rectangular shape or circular/rectangular shapes of various sizes on the second electrode.

Subsequently, at step ST5, the first and second substrates may be electrically connected to each other via a conductive spacer. Then, at step ST6, the first and second substrates may be encapsulated. A seal pattern may be formed at an edge of any one of the first and second substrates to attach the first and second substrates. Then, nitrogen may be injected in a separation space between the first and second substrates.

As a result, the fabrication method according to an embodiment of the present invention forms the array device and the organic electro luminescence device on different substrates, thereby separately controlling the fabrication quality of the array device and the organic electro luminescence. Thus, product failure is reduced and fabrication efficiency is increased. Further, the fabrication includes forming the thin film type absorbent on the second electrode for absorbing moisture in an interior of the device, thereby increasing product life span.

Figure 13:
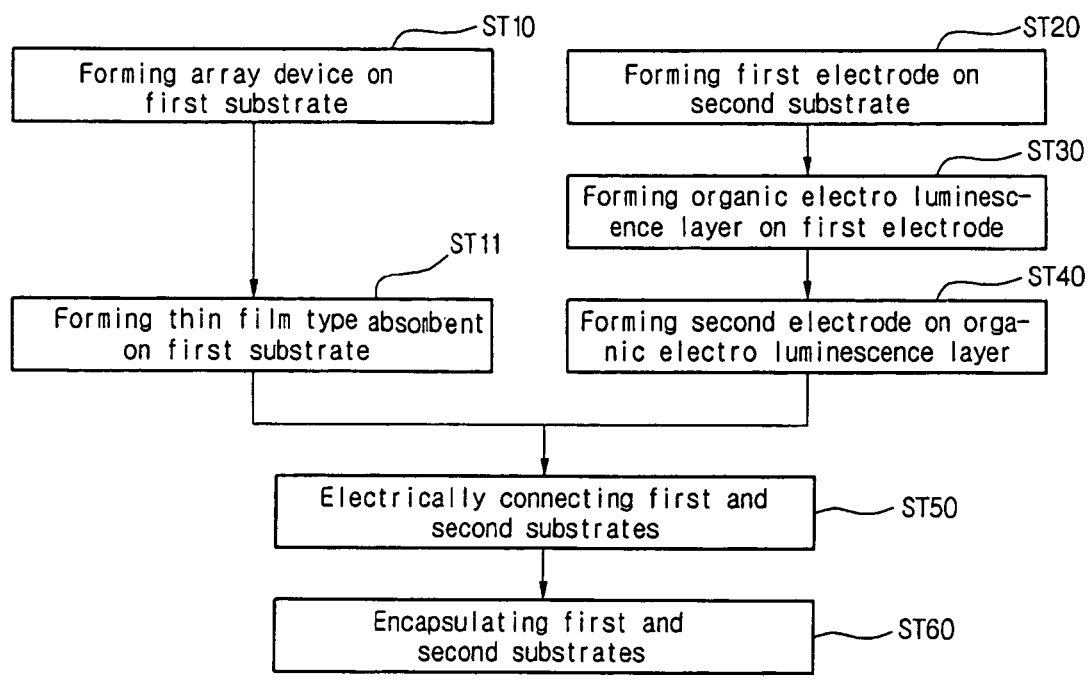
FIG. 13 is a flow chart illustrating a fabrication method of an organic electro luminescence device according to another embodiment of the present invention.

FIG. 13 is a flow chart illustrating a fabrication method of an organic electro luminescence device according to another embodiment of the present invention. As shown in FIG. 13, at step ST10, an array device may be formed on a first substrate. Forming the array device may include forming a buffer layer on the first substrate, forming a semiconductor layer and a capacitor electrode on the buffer layer, forming a gate electrode, source and drain electrodes on the semiconductor layer, and forming a power electrode disposed on the capacitor electrode to be connected with the source electrode. Further, an electrical connection pattern, e.g., a conductive spacer 114 as shown in FIGS. 7 and 10, also may be formed on the first substrate.

At step ST11, a thin film type absorbent may be formed on the first substrate. Forming the thin film type absorbent may include sputtering a conductive absorbent material on the first substrate. In addition, the thin film type absorbent may be formed on a passivation layer covering a driving element of the array device or on a source electrode of the driving element. Further, forming the thin film type absorbent may include forming a plurality of elements having a circular shape, a rectangular shape or circular/rectangular shapes of various sizes on the first substrate.

In addition, at step ST20, a first electrode may be formed on a second substrate. In particular, since the first electrode for an organic electro luminescence diode may be formed directly on the second substrate, a material selection range is broadened and the process can be easily performed. For example, the first electrode may be selected from the conductive material having a transmittance.

Then, at step ST30, an organic electro luminescence layer may be formed on the first electrode. Further, at step ST40, a second electrode may be formed on the organic electro luminescence layer.

Subsequently, at step ST50, the first and second substrates may be electrically connected to each other via a conductive spacer. Then, at step ST60, the first and second substrates may be encapsulated. A seal pattern may be formed at an edge of any one of the first and second substrates to attach the first and second substrates. Then, nitrogen may be injected in a separation space between the first and second substrates.

As a result, the fabrication method according to another embodiment of the present invention forms the array device and the organic electro luminescence device on different substrates, thereby separately controlling the fabrication quality of the array device and the organic electro luminescence. Thus, product failure is reduced and fabrication efficiency is increased. Further, the fabrication includes forming the thin film type absorbent on the array element for absorbing moisture in an interior of the device, thereby increasing product life span.

As described above, the organic electro luminescence device and the fabrication method thereof according to an embodiment of the present invention have an advantage in that the production yield and the efficiency of the production management can be improved, and the thin film transistor can be easily designed and the high aperture ratio/high resolution can be achieved. Further, the organic electro luminescence device and the fabrication method thereof have another advantage in that since the first electrode for the organic electro luminescence diode is directly formed on the substrate, the material selection range can be broadened, and since the top emission type and the encapsulation structure are employed, a stable product can be provided.

Furthermore, the organic electro luminescence device and the fabrication method thereof have another advantage in that the thin film layer having an absorption function is provided to absorb moisture permeated from the external of the panel and the moisture generated from the films layered inside the panel, thereby extending the device life.

It will be apparent to those skilled in the art that various modifications and variations can be made in the organic electroluminescence device and fabrication method thereof of the present invention without departing from the sprit or scope of the invention. Thus, it is intended that the present invention covers the modifications and variations of this invention provided they come within the scope of the appended claims and their equivalents.

What is claimed is:

1. An organic electro luminescence device, comprising:
    an array device having a thin film transistor formed in each of sub-pixel regions on a first substrate;
    a first electrode of an organic electro luminescence diode formed on a second substrate, the first electrode including a metallic material having light transmittance;
    a second electrode and an organic electro luminescence layer of the organic electro luminescence diode formed on the second substrate;
    a conductive spacer for electrically connecting between the thin film transistor and the second electrode; and
    a thin film type absorbent formed on one of the array device and the organic electro luminescence diode, and disposed between the array device and the organic electro luminescence diode,
    wherein the first substrate having the array device and second substrate having the organic electro luminescence diode are attached to each other with a predetermined distance therebetween.

2. The device according to claim 1, wherein the thin film type absorbent completely covers the second electrode.

3. The device according to claim 1, wherein the thin film type absorbent is formed on the second electrode except a contact portion where the second electrode contacts the conductive spacer.

4. The device according to claim 3, wherein the thin film type absorbent is non-conductive.

5. The device according to claim 4, wherein the thin film type absorbent includes calcium oxide (CaO), barium oxide (BaO), or a combination of CaO and BaO.

6. The device according to claim 1, wherein the thin film type absorbent is formed on the first substrate corresponding to each of the sub-pixel regions except a portion where the conductive spacer is formed.

7. The device according to claim 6, wherein the thin film type absorbent is non-conductive.

8. The device according to claim 7, wherein the thin film type absorbent includes calcium oxide (CaO), barium oxide (BaO), or a combination of CaO and BaO.

9. The device according to claim 1, wherein the thin film type absorbent is conductive.

10. The device according to claim 9, wherein the thin film type absorbent includes one of Group 4A element including zirconium (Zr), titanium (Ti) and hafnium (Hf), Group 5A element including niobium (Nb), tantalum (Ta), chromium (Cr) and molybdenum (Mo), Group 7A element including ferrum (Fe) and ruthenium (Ru), and Group 8A element including nickel (Ni) and cobalt (Co).

11. The device according to claim 1, wherein the thin film type absorbent includes a plurality of patterns in a rectangular shape, a circular shape, or a plurality of rectangular/circular shapes of different sizes.

12. The device according to claim 1, wherein the second electrode and the organic electro luminescence layer are patterned to correspond to each of the sub-pixel regions.

13. The device according to claim 1, further comprising barriers formed at boundaries of the sub-pixel regions and on the first electrode, the barriers including an insulating material, wherein the second electrode and the organic electro luminescence layer of the organic electro luminescence diode formed on the first electrode and between the barriers.

* * * * *